United States Patent
Lin (10) Patent No.: US 12,107,020 B2
(45) Date of Patent: Oct. 1, 2024

(54) METHOD AND DEVICE FOR TESTING ARRAY SUBSTRATE, AND COMPUTER READABLE STORAGE MEDIUM

(71) Applicant: HKC CORPORATION LIMITED, Shenzhen (CN)

(72) Inventor: Peixin Lin, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 1006 days.

(21) Appl. No.: 17/033,790

(22) Filed: Sep. 27, 2020

(65) Prior Publication Data

US 2021/0013113 A1    Jan. 14, 2021

Related U.S. Application Data

(63) Continuation of application No. PCT/CN2018/121889, filed on Dec. 19, 2018.

(30) Foreign Application Priority Data

Dec. 5, 2018    (CN) .......................... 201811483443.5

(51) Int. Cl.
*G01R 31/52*    (2020.01)
*G01R 31/26*    (2020.01)
(Continued)

(52) U.S. Cl.
CPC .......... *H01L 22/20* (2013.01); *G01R 31/2607* (2013.01); *G01R 31/52* (2020.01);
(Continued)

(58) Field of Classification Search
CPC ................ G01R 31/52; G01R 31/2607; G02F 1/133351; G02F 1/136259; G09G 3/006; H01L 22/20
See application file for complete search history.

(56) References Cited

U.S. PATENT DOCUMENTS 5,444,390 A * 8/1995 Bartlett .................. G09G 3/006
                                                            324/760.02
6,759,867 B2 * 7/2004 Sohn ...................... G09G 3/006
                                                            324/750.25
(Continued)

FOREIGN PATENT DOCUMENTS

CN    101750554 A    6/2010
CN    103760693 A    4/2014
(Continued)

OTHER PUBLICATIONS

First Office Action in counterpart Chinese Application No. 201811483443.5, dated May 22, 2020.
(Continued)

*Primary Examiner* — Lee E Rodak
*Assistant Examiner* — Demetrius R Pretlow
(74) *Attorney, Agent, or Firm* — Westbridge IP LLC (57) ABSTRACT

Disclosed is a method for testing an array substrate, including: sequentially applying a curing drive signal to curing pad circuits according to an arrangement order of the curing pad circuits in a testing circuit board, the curing pad circuit is connected with at least two array substrates; and performing an array test on the array substrates in the curing pad circuit by the curing drive signal. The present application also discloses a device for testing an array substrate, and a computer readable storage medium.

19 Claims, 5 Drawing Sheets

(51) Int. Cl.
*G02F 1/1362* (2006.01)
*H01L 21/66* (2006.01)
*H01L 27/12* (2006.01)
*G02F 1/1333* (2006.01)

(52) U.S. Cl.
CPC .... *G02F 1/136259* (2013.01); *H01L 27/1259* (2013.01); *G02F 1/133351* (2013.01); *G02F 1/136254* (2021.01)

(56) References Cited

U.S. PATENT DOCUMENTS

| | | | |
|---|---|---|---|
| 10,235,913 B2* | 3/2019 | Zhao | G01R 31/2637 |
| 2003/0184334 A1* | 10/2003 | Matsunaga | G09G 3/3648 |
| | | | 324/760.02 |
| 2005/0057193 A1* | 3/2005 | Ono | G09G 3/3208 |
| | | | 315/169.3 |
| 2005/0204219 A1* | 9/2005 | Taguchi | G09G 3/006 |
| | | | 714/724 |
| 2006/0028232 A1 | 2/2006 | Yu et al. | |
| 2006/0279297 A1* | 12/2006 | Nystrom | G09G 3/3225 |
| | | | 324/754.24 |
| 2013/0120696 A1* | 5/2013 | Shih | G09G 3/3648 |
| | | | 257/E33.012 |
| 2014/0078026 A1* | 3/2014 | Du | G09G 3/006 |
| | | | 345/55 |
| 2014/0320022 A1* | 10/2014 | Lee | H05B 47/175 |
| | | | 315/294 |
| 2015/0123882 A1* | 5/2015 | Hsu | G09G 3/006 |
| | | | 345/55 |
| 2017/0038427 A1* | 2/2017 | Kim | G09G 3/006 |
| 2017/0337860 A1* | 11/2017 | Yi | G09G 3/3648 |
| 2018/0292691 A1* | 10/2018 | Chen | G01R 31/2825 |
| 2019/0019440 A1* | 1/2019 | Lv | G09G 3/3677 |
| 2021/0256889 A1* | 8/2021 | Yuan | G09G 3/006 |

FOREIGN PATENT DOCUMENTS

| | | |
|---|---|---|
| CN | 106526918 A | 3/2017 |
| CN | 106652863 A | 5/2017 |
| CN | 106782248 A | 5/2017 |
| CN | 107037637 A | 8/2017 |
| CN | 107807481 A | 3/2018 |
| CN | 108877616 A | 11/2018 |
| KR | 20040062030 A | 7/2004 |

OTHER PUBLICATIONS

International Search Report and Written Opinion in corresponding PCT Application No. PCT/CN2018/121889, dated Sep. 18, 2019.

* cited by examiner

METHOD AND DEVICE FOR TESTING ARRAY SUBSTRATE, AND COMPUTER READABLE STORAGE MEDIUM

CROSS-REFERENCE TO RELATED APPLICATIONS

The present application is a continuation application of International Application No. PCT/CN2018/121889, filed on Dec. 19, 2018, which claims the benefit of Chinese Patent Application No. 201811483443.5, entitled "METHOD AND DEVICE FOR TESTING ARRAY SUBSTRATE, AND STORAGE MEDIUM", filed on Dec. 5, 2018, which is hereby incorporated by reference in its entirety.

TECHNICAL FIELD

The present application relates to the technical field of thin film transistor array substrate, and in particular, relates to a method and a device for testing an array substrate, and a computer readable storage medium.

BACKGROUND

The statements herein only provide background information related to the present application and do not necessarily constitute the prior art. In the production of a display panel, a testing circuit board is necessary to test and cure an array substrate, when the array substrate is manufactured.

Each testing circuit board may include a plurality of array substrates. And when array substrates are tested, each array substrate is applied with a testing drive signal through its corresponding array testing pad circuit, in a sequence according to the wiring arrangement of the array substrates. Such block-by-block testing would result in a low efficiency.

SUMMARY

The main object of the present application is to provide a method and a device for testing an array substrate, and a computer readable storage medium. It is realized that at least two array substrates are tested by applying an array testing signal at a time, thereby the efficiency of testing array substrate is improved.

In order to achieve the above object, the present application provides a method for testing an array substrate, which includes:
  sequentially applying a curing drive signal to a curing pad circuit according to an arrangement order of the curing pad circuit in a testing circuit board, the curing pad circuit being connected with at least two array substrates; and
  performing an array test on the array substrate in the curing pad circuit by the curing drive signal.

Optionally, after the operation of performing an array test on the array substrates in the curing pad circuit by the curing drive signal, the method also includes:
  acquiring all curing pad circuits which are tested to be non-conductive by the curing drive signal;
  taking the array substrates in the acquired non-conductive curing pad circuits as target array substrates; and
  sequentially performing an array test on the target array substrates according to an arrangement order of the testing pad circuits in the testing circuit board corresponding to the target array substrates.

Optionally, the operation of sequentially performing an array test on the target array substrates according to an arrangement order of the testing pad circuits in the testing circuit board corresponding to the target array substrates includes:
  sequentially applying a testing drive signal to the testing pad circuits according to an arrangement order of the testing pad circuits in the testing circuit board; and
  performing an array test on the target array substrates by the testing drive signal.

Optionally, after the operation of sequentially performing an array test the target array substrates according to an arrangement order of the testing pad circuit in the testing circuit board corresponding to the target array substrates, the method also includes:
  determining that the target array substrates fail to pass the array test, when the array substrates are tested to be open circuits or short circuits; and
  determining that the target array substrates pass the array test, when the array substrates are tested to be conductive.

Optionally, after the operation of performing an array test on the array substrates in the curing pad circuit by the curing drive signal, the method further includes:
  acquiring a testing pad circuit corresponding to the array substrates in the curing pad circuit, when the result of the curing drive signal test is non-conductive; and
  performing an array test on the array substrates in the curing pad circuit according to an arrangement order of the testing pad circuit in the testing circuit board.

Optionally, the operation of performing an array test on the array substrates in the curing pad circuit according to an arrangement order of the testing pad circuit in the testing circuit board includes:
  sequentially applying a testing drive signal to the testing pad circuit according to an arrangement order of the testing pad circuit in the testing circuit board; and
  performing an array test on an array substrate in the curing pad circuit by the testing drive signal.

Optionally, after the operation of performing an array test on the array substrates in the curing pad circuit according to an arrangement order of the testing pad circuit in the testing circuit board, the method also includes:
  determining that the array substrates fail to pass the array test, when the array substrates are tested to be open circuits or short circuits; and
  determining that the array substrates pass the array test, when the array substrates are tested to be conductive.

Optionally, after the operation of performing an array test on the array substrates in the curing pad circuit by the curing drive signal, the method further includes:
  determining that all the array substrates in the curing pad circuit pass the array test, when the array substrates are tested to be conductive.

In order to achieve the above object, the present application also provides a device for testing an array substrate, which includes:
  the device includes a memory, a processor, and a program for testing an array substrate, the program being stored in the memory and executable by the processor, the processor executes the program to implement the above operations.

In order to achieve the above object, the present application also provides a computer readable storage medium, in which a program for testing an array substrate is stored, and a processor executes the program to implement the above operations.

According to the method and device for testing an array substrate, and a computer readable storage medium provided by the present application, a curing drive signal is sequentially applied to curing pad circuits according to an arrangement order of the curing pad circuits in a testing circuit board, the curing pad circuit is connected with at least two array substrates; and the array substrates in the curing pad circuit are tested by the curing drive signal. In this way, by taking the curing drive signal as the array testing signal, it is realized that at least two array substrates are tested by applying an array testing signal at a time. Thereby the efficiency of testing array substrate is improved.

The realization, functional features and advantages of the purpose of the present disclosure will be further described with reference to the accompanying drawings in conjunction with the embodiments.

DETAILED DESCRIPTION OF THE EMBODIMENTS

It should be understood that the specific embodiments described herein are only for the purpose of explaining the present disclosure and are not intended to limit the present disclosure.

The present application provides a method for testing an array substrate. By taking the curing drive signal as the array testing signal, it is realized that at least two array substrates are tested by applying an array testing signal at a time. Thereby the efficiency of testing array substrate is improved.

Figure 1:
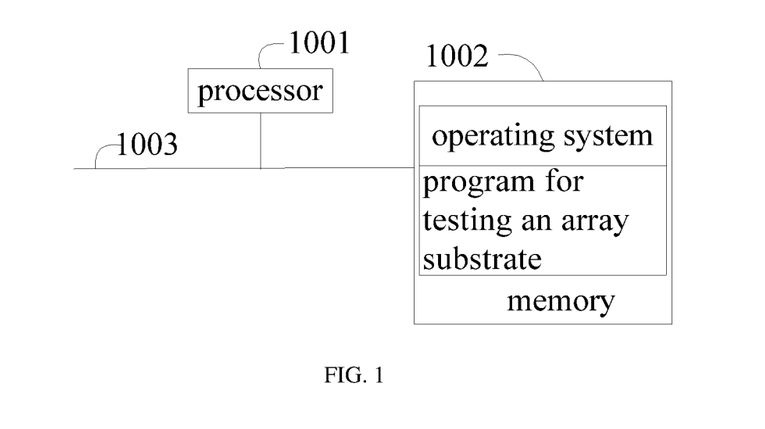
FIG. 1 is a schematic diagram of a terminal hardware operating environment according to some embodiments of the present application.

As shown in FIG. 1, FIG. 1 is a schematic diagram of a hardware operating environment of a terminal according to some embodiments of the present application.

The terminal in the embodiments of the present application may be a device for testing an array substrate.

As shown in FIG. 1, the terminal may include a processor 1001, such as a Central Processing Unit (CPU), a memory 1002, and a communication bus 1003. And, the communication bus 1003 is configured to enable connecting communication between the components of the terminal. The memory 1002 may be a high-speed Random-Access Memory (RAM) or a Non-Volatile Memory, such as a disk memory. The memory 1002 may optionally be a memory device independent from the aforementioned processor 1001.

It may be understood by those skilled in the art that the terminal structure shown in FIG. 1 does not constitute a definition of the terminal in the embodiments of the present application, and may include more or fewer components than that are shown in the FIG. 1, or may combine some components, or may be different arrangements of the components.

As shown in FIG. 1, a memory 1002 as a storage medium may include a program for testing an array substrate.

In the terminal as shown in FIG. 1, the processor 1001 may be configured to enable the program stored in the memory 1002, and execute the following operations:

a curing drive signal is sequentially applied to curing pad circuits according to an arrangement order of the curing pad circuits in a testing circuit board, the curing pad circuit is connected with at least two array substrates; and the array substrates in the curing pad circuit are tested by the curing drive signal.

Optionally, the processor 1001 may enable the program stored in the memory 1002, and execute the following operations:

acquiring all the curing pad circuits which are tested to be non-conductive by the curing drive signal;

taking the array substrates in the acquired non-conductive curing pad circuits as target array substrates; and sequentially performing an array test on the target array substrates according to an arrangement order of the testing pad circuit in the testing circuit board corresponding to the target array substrates.

Optionally, the processor 1001 may enable the program stored in the memory 1002, and execute the following operations:

sequentially applying a testing drive signal to the testing pad circuit according to an arrangement order of the testing pad circuit in the testing circuit board; and performing an array test on the target array substrates by the testing drive signal.

Optionally, the processor 1001 may enable the program stored in the memory 1002, and execute the following operations:

determining that the target array substrates fail the test, when the array is tested open circuit or short circuit; and determining that the target array substrates to pass the test, when the array is tested conductive.

Optionally, the processor 1001 may enable the program stored in the memory 1002, and execute the following operations:

acquiring a testing pad circuit corresponding to the array substrates in the curing pad circuit, when the result of the curing drive signal test is non-conductive; and performing an array test on the array substrates in the curing pad circuit according to an arrangement order of the testing pad circuit in the testing circuit board.

Optionally, the processor 1001 may enable the program stored in the memory 1002, and execute the following operations:

sequentially applying a testing drive signal to the testing pad circuit according to an arrangement order of the testing pad circuit in the testing circuit board; and performing an array test on an array substrate in the curing pad circuit by the testing drive signal.

Optionally, the processor 1001 may enable the program stored in the memory 1002, and execute the following operations:

determining that the array substrates fail the test, when the array is tested open circuit or short circuit; and determining that the array substrates pass the test, when the array is tested conductive.

Optionally, the processor 1001 may enable the program stored in the memory 1002, and execute the following operations: determining that all the array substrates in the curing pad circuit pass the test, when the array is tested conductive.

Figure 2:
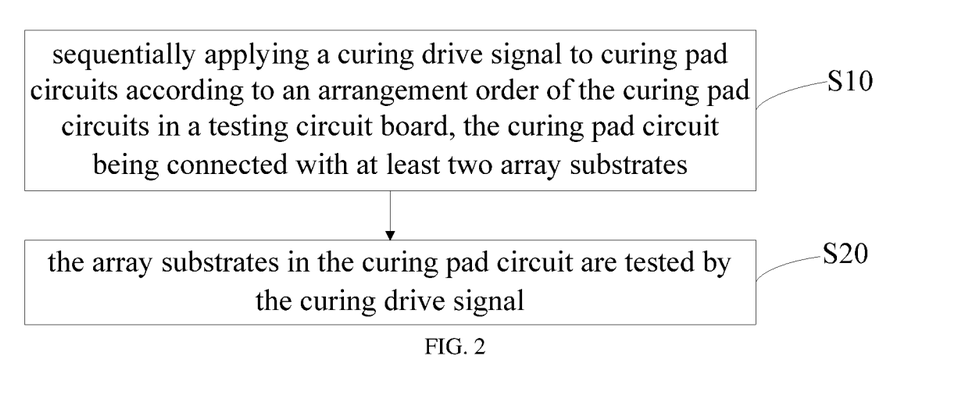
FIG. 2 is a flowchart of a method for testing an array substrate according to some embodiments of the present application.

Referring to FIG. 2, in some embodiments, the method for testing the array substrate includes: S10 sequentially applying a curing drive signal to curing pad circuits according to an arrangement order of the curing pad circuits in a testing circuit board, the curing pad circuit being connected with at least two array substrates.

Figure 6:
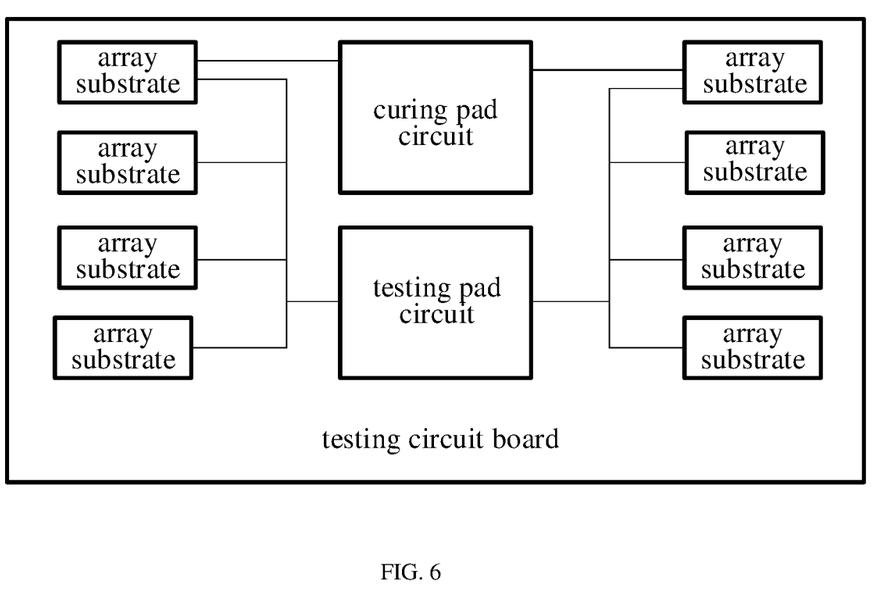
FIG. 6 is a schematic diagram of a testing circuit board including array substrates, a curing pad circuit, and a testing pad circuit. The curing pad circuit is connected with at least two array substrates.

In the embodiments, during the production of a liquid crystal display panel, a testing circuit board is necessary to perform an array test on the array substrates, when the Thin Film Transistor array substrates are manufactured. Optionally, as shown in FIG. 6, when forming a testing circuit board which is configured to test, a testing circuit board including 8 array substrates is formed.

Array test is a method to uniformly charge all pixels on the array substrate and then find various electrical defects. In order to uniformly charge all pixels on an array substrate, as shown in FIG. 6, gate lines, data lines and common electrode lines on the array substrate can be connected to an array testing pad circuit in a short-circuit manner, and then array testis carried out on the array substrate in sequence by sequentially applying test drive signals to the array testing pad circuit according to the arrangement sequence of the array testing pad circuit in the testing circuit board to take the test drive signals as array test signals. However, this array test which tests array substrates block by block will lead to a low testing efficiency of the array substrate.

Since in the subsequent process of manufacturing the array substrate, it is necessary to pair the array substrate with the Color Filter, and carry out Polymer-stabilized Vertical Alignment Curing (PSVA Curing). As a result, a Polymer-stabilized Vertical Alignment Curing PAD (PSVA Curing PAD) which is configured to perform the PSVA curing process is formed, when forming a testing circuit board. That is, as shown in FIG. 6, the testing circuit board may generally include a curing pad circuit.

Since each curing pad circuit may be connected with at least two array substrates, the array substrates may be array tested by applying a curing drive signal as an array testing signal to the curing pad circuit, so as to improve the efficiency of array test on the array substrate.

Optionally, the curing pad circuit is connected with two array substrates.

S20 the array substrates in the curing pad circuit are tested by the curing drive signal.

Specifically, a curing drive signal is sequentially applied to curing pad circuits according to an arrangement order of the curing pad circuits in a testing circuit board, the array substrates may be array tested by the curing drive signal taken as an array testing signal. The curing pad circuit is connected with at least two array substrates.

Optionally, after the array test signal passes through the curing pad circuit, if there exists difference of signal waveform between the received array testing signal and the testing signal input before passing through the curing pad circuit, it may be determined that the curing pad circuit is non-conductive. That is, there exists at least one array substrate in the curing pad circuit which is open or short. If there is no difference of signal waveform between the received array testing signal and the testing signal input before passing through the curing pad circuit, it may be determined that the curing pad circuit is conductive. That is, all the tested array substrate connected in the curing pad circuit are conductive.

Therefore, after the array substrate in the curing pad circuit is subjected to array test by the curing drive signal, all array substrates in the curing pad circuit may be determined as passing the array test, when one curing pad circuit is tested to be conductive by the curing drive signal. When one curing pad circuit is tested to be non-conductive, all array substrates in the curing pad circuit are sequentially subjected to array test again based on the testing pad circuit, so as to identify the array substrates which actually exist in the array substrates and fail the array test.

After the array substrate is subjected to array test, all the array substrates that fail the test are acquired, that is, all the array substrates that fail the test are acquired as defective products, array repair is carried out on the array substrates that fail the test, and the abnormal structure of the array circuits of the array substrates that fail the test is repaired by a laser processing method, so that the array circuits of the array substrates are restored to normal.

Optionally, all array substrates subjected to array repair are acquired, and array tests are performed on the array substrates subjected to array repair again according to the arrangement order of the testing pad circuit in the testing circuit board corresponding to the array substrates, so as to check whether the array repair is complete.

After the array substrate in the testing circuit board is subjected to array test and array repair, a Color Filter corresponding to the testing circuit board, i.e., a Color Filter, may be configured. After the testing circuit board and the color filter are paired, a PSVA Curing is performed on the testing circuit board and the color film based on the curing pad circuit of the testing circuit board, and a liquid crystal box is manufactured based on the cured testing circuit board and the color film. In this way, the efficiency of manufacturing the liquid crystal cell may be improved.

Of course, if all the array substrates in the testing circuit board pass the array test, after the testing circuit board and the color filter are paired, a PSVA Curing is performed on the testing circuit board and the color film based on the curing pad circuit of the testing circuit board by directly using the testing circuit board, and a liquid crystal box is manufactured based on the cured testing circuit board and the color film.

Specifically, a whole glass substrate, which is formed after pairing the testing circuit board with a color film, and has been subjected to a curing process, is cut and ground to form the liquid crystal cells. For example, for a glass substrate composed of a testing circuit board which includes eight array substrates, eight liquid crystal cells may be cut.

In some embodiments, a curing drive signal is sequentially applied to curing pad circuits according to an arrangement order of the curing pad circuits in a testing circuit board, the curing pad circuit is connected with at least two array substrates; and an array test is performed on the array substrates in the curing pad circuit by the curing drive signal. In this way, by taking the curing drive signal as the array testing signal, it is realized that at least two array substrates are tested by applying an array testing signal at a time. Thereby the efficiency of testing array substrate is improved.

Figure 3:
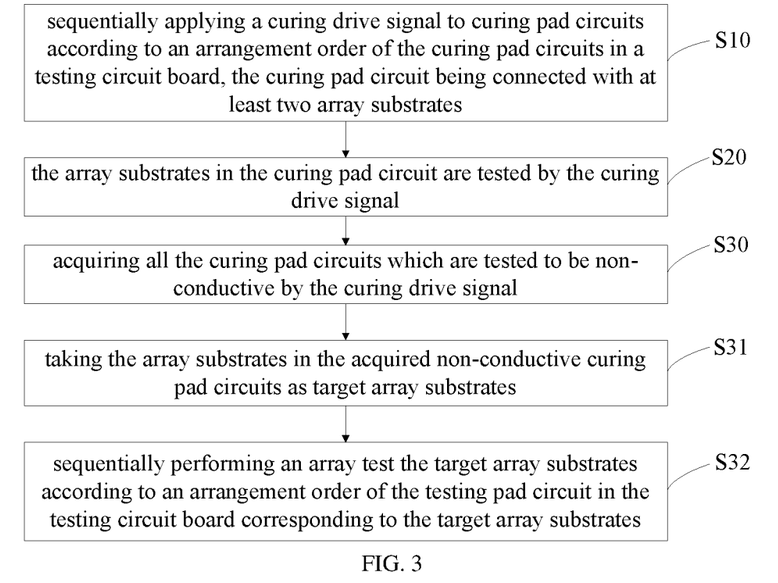
FIG. 3 is a flowchart of a method for testing an array substrate according to some other embodiments of the present application.

In another embodiment, as shown in FIG. 3, on the basis of the embodiments shown in FIG. 2 above, after the operation of performing an array test on the array substrates in the curing pad circuit by the curing drive signal, the method further includes:

S30 acquiring all the curing pad circuits which are tested to be non-conductive by the curing drive signal;

S31 taking the array substrates in the acquired non-conductive curing pad circuits as target array substrates; and S32 sequentially performing an array test the target array substrates according to an arrangement order of the testing pad circuit in the testing circuit board corresponding to the target array substrates.

In the embodiment, after curing drive signals are sequentially applied to the curing pad circuits in the testing circuit board, all the non-conductive curing pad circuits in the testing circuit board that are tested to be non-conductive by curing drive signals are acquired, and all the array substrates in the non-conductive curing pad circuits are taken as target array substrates. A testing drive signal is sequentially applied on the testing pad circuit, according to the arrangement order of the testing pad circuit in the testing circuit board corresponding to the target array substrates. And the testing drive signals are taken as testing signals to sequentially perform array test on all the target array substrates.

Then the array test result of each target array substrate is acquired. The target array substrates are determined as failing the test, when the array is tested open circuit or short circuit; when the array is tested conductive, the target array substrates are determined as passing the test.

In one embodiment, all the curing pad circuits which are tested to be non-conductive by the curing drive signal are acquired; taking the array substrates in the acquired non-conductive curing pad circuits as target array substrates; and The array test on the target array substrates is sequentially performed according to the arrangement order of the testing pad circuit in the testing circuit board corresponding to the target array substrates. In this way, in the testing circuit board, after array test is carried out on the array substrate with the curing pad circuit as the basic testing unit, all the array substrates in the curing pad circuits that are tested to be non-conductive are uniformly acquired. Then based on the testing pad circuit, array test is uniformly carried out on the array substrates in the curing pad circuits that are tested to be non-conductive, with each array substrate being as the basic test unit. So that the defective array substrates in the target array substrates may be quickly identified, and the efficiency of array test on the array substrate is improved.

Figure 4:
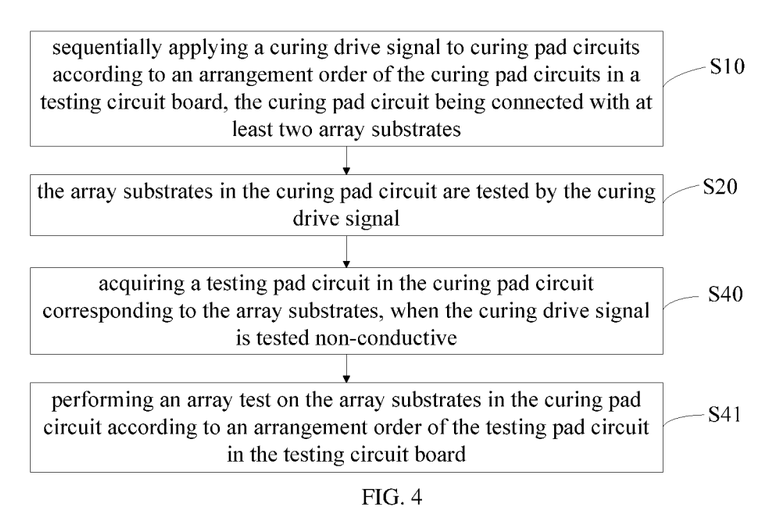
FIG. 4 is a flowchart of a method for testing an array substrate according to some different embodiments of the present application.

In still another embodiment, as shown in FIG. 4, on the basis of the embodiments shown in FIGS. 2 and 3, after the operation of performing an array test on the array substrates in the curing pad circuit by the curing drive signal, the method further includes:

S40 acquiring a testing pad circuit in the curing pad circuit corresponding to the array substrates, when the result of the curing drive signal test is non-conductive; and S41 performing an array test on the array substrates in the curing pad circuit according to an arrangement order of the testing pad circuit in the testing circuit board.

In this embodiment, after the curing drive signal is applied to the curing pad circuits in the testing circuit board, a testing pad circuit corresponding to the array substrates in the curing pad circuit is acquired, when the result of the curing drive signal test is non-conductive. A testing drive signal is sequentially applied on the testing pad circuit, according to the arrangement order of the testing pad circuit in the testing circuit board. And the testing drive signals are taken as testing signals to sequentially perform array test on the target array substrates in the curing pad circuits.

Then an array test result of each array substrate in the curing pad circuit is acquired. The array substrates are determined as failing the test, when the array is tested open circuit or short circuit; when the array is tested conductive, the array substrates are determined as passing the test.

In one embodiment, a testing pad circuit corresponding to the array substrates in the curing pad circuit is acquired, when the result of the curing drive signal test is non-conductive, performing an array test on the array substrates in the curing pad circuit according to an arrangement order of the testing pad circuit in the testing circuit board. In this way, in the testing circuit board, after array test is carried out on the array substrate with the curing pad circuit as the basic testing unit, the array substrates in the curing pad circuits that are tested to be non-conductive are acquired. Then array test is carried out on all the array substrates in the curing pad circuit that are tested to be non-conductive, based on the testing pad circuit. And array test is carried out on the array substrates by combining the curing pad circuit test and the testing pad circuit test, thus improving the efficiency of array test of the array substrates in the testing circuit board.

Figure 5:
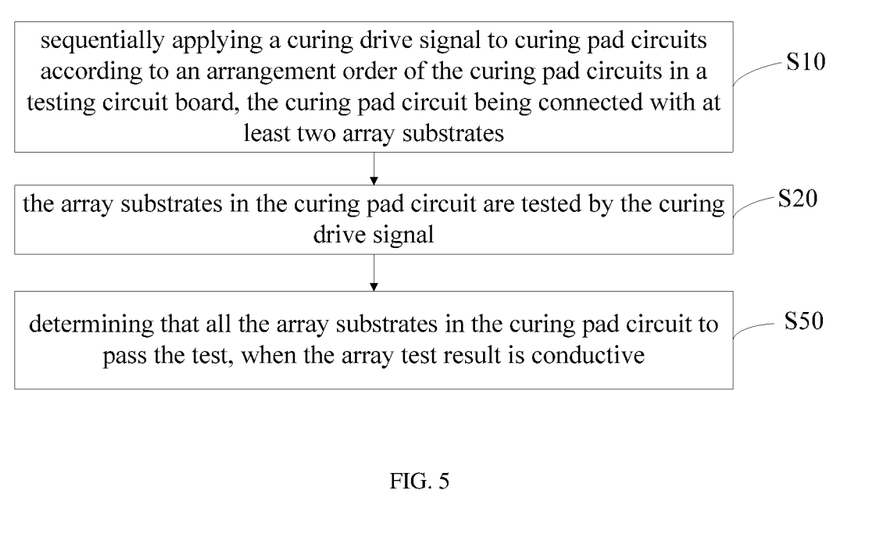
FIG. 5 is a flowchart of a method for testing an array substrate according to some different embodiments of the present application.

In still another embodiment, as shown in FIG. 5, on the basis of the embodiments shown in FIGS. 2 and 4, after the operation of performing an array test on the array substrates in the curing pad circuit by the curing drive signal, the method further includes: S50 determining that all the array substrates in the curing pad circuit to pass the test, when the array is tested conductive.

In the embodiment, after a curing drive signal is applied to the curing pad circuit in the testing circuit board, all array substrates in the curing pad circuit may be determined as passing the array test, when one curing pad circuit is tested to be conductive. A testing circuit board in which one curing pad circuit is connected with two array substrates is taken as an example. If each curing pad circuit in the testing circuit board is tested to be conductive, the efficiency may be doubled as compared with the method in which the array substrates are tested one by one based on the testing pad circuit.

In addition, the present application also proposes a device for testing an array substrate, which includes a memory, a processor, and a program for testing an array substrate. The program is stored in the memory and is executable by the processor, the processor executes the program to implement the operations of the method for testing an array substrate in above embodiments.

In addition, the present application also proposes a computer readable storage medium which includes a program for testing an array substrate, and a processor executes the program to implement the operations of the method for testing an array substrate in above embodiments.

The above-mentioned serial numbers of the embodiments of the present disclosure are for the purpose of description only and do not represent the advantages and disadvantages of the embodiments.

From the description of the above embodiments, it is clear to those skilled in the art that the method of the above embodiments may be implemented by means of software and necessary general-purpose hardware platform, although it may also be implemented by hardware. Based on such understanding, the technical schemes of the present disclosure, in essence, or the part contributing to the prior art, may be embodied in the form of a software product. The software product is stored in a storage medium (such as ROM/RAM, magnetic disk, optical disk) as described above, including several instructions for enabling a terminal device (which may be a television, a mobile phone, computer, server, air conditioner, or network device, etc.) to perform the methods described in various embodiments of the present disclosure.

The above is only alternative embodiments of the present disclosure and is not intended to limit the patent scope of the present disclosure. Any equivalent structure or equivalent process transformation made by using the contents of the specification and drawings of the present disclosure, or directly or indirectly applied in other related technical fields, is similarly included in the patent protection scope of the present disclosure.

What is claimed is:

1. A method for testing an array substrate, comprising:
sequentially applying a curing drive signal to a curing pad circuit, according to an arrangement order of the curing pad circuit in a testing circuit board, wherein the curing pad circuit is connected with at least two array substrates;
performing an array test on the at least two array substrates connected to the curing pad circuit by the curing drive signal;
selecting a testing pad circuit corresponding to the at least two array substrates connected to the curing pad circuit, when the curing pad circuit is tested non-conductive; and
performing an array test on the at least two array substrates connected to the curing pad circuit according to an arrangement order of the testing pad circuit in the testing circuit board.

2. The method according to claim 1, wherein after the operation of performing an array test on the at least two array substrates connected to the curing pad circuit by the curing drive signal, the method further comprises:
selecting a curing pad circuit tested to be non-conductive by the curing drive signal;
taking an array substrate in the acquired non-conductive curing pad circuit as a target array substrate; and
sequentially performing an array test on the target array substrate according to an arrangement order of a testing pad circuit in the testing circuit board corresponding to the target array substrate.

3. The method according to claim 2, further comprising:
determining that the target array substrate fails to pass the array test, when the array substrate is tested to be open circuit or short circuit; and
determining that the target array substrate passes the array test, when the array substrate is tested to be conductive.

4. The method according to claim 2, wherein the operation of sequentially performing an array test the target array substrate according to an arrangement order of the testing pad circuit in the testing circuit board corresponding to the target array substrate, comprises:
sequentially applying a testing drive signal to the testing pad circuit according to the arrangement order of the testing pad circuit in the testing circuit board; and
performing the array test on the target array substrate by the testing drive signal.

5. The method according to claim 4, wherein after the operation of performing the array test on the target array substrate by the testing drive signal, the method further comprises:
determining that the target array substrate fails to pass the array test, when the array substrate is tested to be open circuit or short circuit; and
determining that the target array substrate passes the array test, when the array substrate is tested to be conductive.

6. The method according to claim 1, wherein after the operation of performing an array test on the at least two array substrates connected to array substrate in the curing pad circuit according to an arrangement order of the testing pad circuit in the testing circuit board, the method further comprises:
determining that the at least two array substrates fail to pass the array test, when the at least two array substrates are is tested to be open circuit or short circuit; and
determining that the at least two array substrates pass the array test, when the at least two array substrates are tested to be conductive.

7. The method according to claim 1, wherein the operation of performing an array test on the at least two array substrates connected to the curing pad circuit according to an arrangement order of the testing pad circuit in the testing circuit board, comprises:
sequentially applying a testing drive signal to the testing pad circuit according to the arrangement order of the testing pad circuit in the testing circuit board; and
performing an array test on the at least two array substrates connected to the curing pad circuit by the testing drive signal.

8. The method according to claim 7, wherein after the operation of performing an array test on the at least two array substrates connected to the curing pad circuit by the testing drive signal, the method further comprises:
determining that the at least two array substrates fail to pass the test, when the at least two array substrates are is tested to be open circuit or short circuit; and
determining that the at least two array substrates pass the test, when the at least two array substrates are array substrate is tested to be conductive.

9. The method according to claim 1, wherein after the operation of performing an array test on the at least two array substrates connected to the curing pad circuit by the curing drive signal, the method further comprises:
determining that the at least two array substrates connected to the curing pad circuit pass the test, when the at least two array substrates are tested to be conductive.

10. The method according to claim 1, wherein before the operation of sequentially applying a curing drive signal to curing pad circuit according to an arrangement order of the curing pad circuit in a testing circuit board, the method further comprises:
forming the testing circuit board comprising a plurality of array substrates.

11. The method according to claim 1, wherein the testing circuit board comprises eight array substrates.

12. The method according to claim 1, wherein the curing pad circuit is connected with two array substrates.

13. The method according to claim 1, wherein the array substrate is connected with one testing pad circuit.

14. The method according to claim 1, wherein the method further comprises:
selecting an array substrate which fails to pass the array test, and repairing a failed array substrate by array repair.

15. The method according to claim 14, wherein after the operation of selecting an array substrate which fails to pass the test, and repairing the failed array substrate by array repair, the method further comprises:
selecting a repaired array substrate; and
performing an array test on the repaired array substrate according to an arrangement order of the testing pad circuit in the testing circuit board corresponding to the array substrate.

16. The method according to claim 1, wherein the method further comprises:

selecting a repaired array substrate acquiring a color film corresponding to the testing circuit board, when the array substrate in the testing circuit board passes the array test; and pairing the testing circuit board with the color film, and performing a testing curing process based on the testing pad circuit in the testing circuit board.

17. The method according to claim 16, wherein after the operation of pairing the testing circuit board with the color film, and performing a testing process based on the testing pad circuit in the testing circuit board, the method further comprises:

manufacturing a liquid crystal cell, based on the cured testing circuit board and the color film.

18. A device for testing an array substrate, comprising a memory, a processor, and a program for testing an array substrate, the program being stored in the memory and executable by the processor to implement:

sequentially applying a curing drive signal to curing pad circuits according to an arrangement order of the curing pad circuits in a testing circuit board, the curing pad circuit being connected with at least two array substrates;

performing an array test on the at least two array substrates connected to the curing pad circuit by the curing drive signal;

selecting a testing pad circuit corresponding to the at least two array substrates connected to in the curing pad circuit, when the curing pad circuit is tested non-conductive; and performing an array test on the at least two array substrates connected to the curing pad circuit according to an arrangement order of the testing pad circuit in the testing circuit board.

19. A non-transitory computer readable storage medium, wherein a program for testing an array substrate is stored in the non-transitory computer readable storage medium and executable by a processor to implement:

sequentially applying a curing drive signal to curing pad circuits according to an arrangement order of the curing pad circuits in a testing circuit board, the curing pad circuit being connected with at least two array substrates;

performing an array test on the at least two array substrates connected to the curing pad circuit by the curing drive signal;

selecting a testing pad circuit corresponding to the at least two array substrates connected to in the curing pad circuit, when the curing pad circuit is tested non-conductive; and performing an array test on the at least two array substrates connected to the curing pad circuit according to an arrangement order of the testing pad circuit in the testing circuit board.

\* \* \* \* \*